United States Patent [19]

Blackwell et al.

[11] Patent Number: 5,288,541

[45] Date of Patent: Feb. 22, 1994

[54] METHOD FOR METALLIZING THROUGH HOLES IN THIN FILM SUBSTRATES, AND RESULTING DEVICES

[75] Inventors: Kim J. Blackwell, Owego; Pei C. Chen, Endicott; Stephen E. Deliman, Endicott; Allan R. Knoll, Endicott, all of N.Y.; George J. Matarese, Bradenton, Fla.; Richard D. Weale, Owego, N.Y.

[73] Assignee: International Business Machines Corporation, Armonk, N.Y.

[21] Appl. No.: 779,411

[22] Filed: Oct. 17, 1991

[51] Int. Cl.⁵ .............................................. B32B 9/00
[52] U.S. Cl. .................................... 428/209; 428/901
[58] Field of Search ................................ 428/901, 209

[56] References Cited

U.S. PATENT DOCUMENTS

| | | | |
|---|---|---|---|
| 4,254,172 | 3/1981 | Takahashi et al. | 428/901 |
| 4,826,720 | 5/1989 | Wade | 428/209 |
| 4,937,133 | 6/1990 | Watanabe et al. | 428/209 |

Primary Examiner—Patrick J. Ryan
Assistant Examiner—Cathy K. Lee
Attorney, Agent, or Firm—Bernard Tiegerman

[57] ABSTRACT

A method for vapor phase depositing a thin seed layer of, for example, chromium and copper onto the side walls of through holes in thin film substrates of, for example, polyimide is disclosed. This method is useful in fabricating devices such as a thin film semiconductor chip carrier in which a semiconductor chip mounted on one major surface of the chip carrier is electrically connected to a ground plane and/or a power conductor on the other major surface of the chip carrier via one or more metallized through holes.

34 Claims, 2 Drawing Sheets

METHOD FOR METALLIZING THROUGH HOLES IN THIN FILM SUBSTRATES, AND RESULTING DEVICES

BACKGROUND OF THE INVENTION

1. Field of the Invention

The invention pertains to methods for fabricating devices which include thin film substrates of, for example, polyimide, having metal-containing through holes, as well as the resulting devices.

2. Description of the Related Art

Among the substrates currently being used as semiconductor chip carriers, i.e., carriers of semiconductor integrated circuit devices, are thin, electrically insulating, flexible films of organic polymeric material, such as polyimide. Currently, such a thin, flexible film serves to support a relatively fragile lead frame, which includes free-standing inner and outer leads. This lead frame is usually fabricated by depositing, e.g., sputter depositing, a relatively thin layer of chromium, which serves as an adhesive layer, and a relatively thick layer of copper, onto an upper surface of the film. Conventional photolithographic techniques are used to pattern the deposited metal into the desired lead frame configuration, and portions of the polymeric film are etched away to produce the free-standing inner and outer leads. A semiconductor chip is mounted on, and attached to, the polymeric film carrier by bonding, e.g., thermo-compression bonding, the free-standing inner leads to contact pads on the chip. In turn, the resulting chip carrier is mounted on, and attached to, a printed circuit card or printed circuit board by soldering the free-standing outer leads to the card or board.

The above-described thin film chip carriers are usually processed while in a roll format. Because the thermo-compression bonding referred to above is automated, this processing has come to be known as tape automated bonding (TAB).

Recently, a new thin film chip carrier configuration has been proposed in which the chip carrier is provided with a ground plane and/or a power conductor on the back side (the non-chip-bearing side) of the polymeric film, through which a ground potential and/or electrical power is to be supplied to one or more chip components. In addition, in this new configuration, a number of metallized through holes, extending through the thickness of the polymeric film, are to be included, some of which are to serve as electrical connections between certain chip components (to be supplied with a ground potential or electrical power) and the ground plane or power conductor. Others of these metallized through holes are to serve as electrical connections between other chip components and circuitry on a printed circuit card or printed circuit board.

In the new thin film chip carrier configuration, the usual free-standing inner and outer leads are to be replaced with metallized circuit lines on the chip-bearing surface of the polymeric film, which circuit lines adhere to the polymeric film and intersect metallized lands encircling the metallized through holes, or directly intersect the metallized through holes. It is envisioned that one or more chips will be mounted face-down on the chip bearing surface of the polymeric film, using solder balls to provide mechanical and electrical connections between contact pads on the chip or chips and the circuit lines on the polymeric film. Moreover, the resulting chip carrier is to be mounted on a printed circuit card or printed circuit board using solder balls to mechanically and electrically connect certain of the metallized through holes to circuitry on the card or board.

Because it is expected that the new proposed thin film chip carriers will also be processed in a roll format, and because it is envisioned that there will be area arrays of through holes, the corresponding processing has come to be known as area array tape automated bonding (ATAB).

The new proposed thin film chip carrier, described above, presupposes that the through holes in the polymeric films can be metallized using conventional techniques applicable to, for example, epoxy/fiberglass printed circuit boards. In the latter case, metallization of through holes is achieved by first forming a relatively thin seed layer of an essentially pure palladium-tin colloid on the side walls of the through holes, using conventional wet seeding techniques, i.e., by placing the printed circuit board into an appropriate chemical bath. Subsequently, copper is deposited onto the resulting seed layer using conventional electroplating techniques.

Attempts have been made to form thin seed layers of essentially pure palladium-tin colloids on the side walls of through holes in thin polyimide films. However, these attempts have failed because the resulting seed layers exhibited unacceptably low adhesion to the side walls, as did any copper electroplated onto the seed layers.

Thus, those engaged in the development and manufacture of thin film devices such as thin film polymeric chip carriers have sought, thus far without success, techniques for forming seed layers on the side walls of through holes in polymeric films having acceptably high adhesion.

SUMMARY OF THE INVENTION

The invention involves the finding that thin seed layers of, for example, chromium and copper, having acceptably high adhesion, are readily vapor phase deposited, e.g., sputtered or electron-beam evaporated, onto the side walls of through holes in, as well as onto the upper and lower surfaces of, thin film substrates of organic polymeric material, such as polyimide, polytetrafluoroethylene, polyetheretherketone, polyethersulfone and polyester. However, the invention also involves the finding that these thin film substrates undergo a significant amount of heating during such vapor phase deposition. This heating produces thermal expansions of these substrates, resulting in significant displacements of the through holes from their original positions, which displacements vary in size, usually linearly, along the length and width of a thin film substrate. Such displacements are undesirable because the subsequent photolithographic patterning of a seed layer on the upper surface of a thin film substrate, used to define, for example, metallized lands encircling the through holes and metallized circuit lines intersecting the metallized lands, assumes there are no significant displacements of the through holes. Because this assumption is wrong, and because it is very difficult to compensate for the varying thermal displacements of the through holes during the photolithographic patterning of the corresponding lands, such patterning results in lands which have little or no overlap with the through holes. As a consequence, because the lands and circuit lines serve as one of the electrodes during subsequent electroplating of copper, and because there are now few, if any, electrical connections between the lands and the through holes, little or no copper is deposited into the through holes. Moreover, because of the are essentially useless as electrical connections between, for example, a chip or chips to be mounted on the thin film polymeric substrate and, for example, a ground plane on the bottom of the thin film substrate or circuitry on a printed circuit card or printed circuit board.

The invention further involves the finding that by appropriately conductively cooling the thin film substrates during vapor phase deposition of metal, the undesirable thermal displacements of the through holes are substantially reduced or largely eliminated. That is, simply mounting a thin film substrate, with through holes, on, for example, a chilled drum during vapor phase deposition of metal is ineffective because there are often burrs at the bottom of the through holes which prevent good thermal contact between the thin film substrate and the chilled drum in the region of the through holes. In fact, even in the absence of such burrs, good thermal contact is not achieved. Good thermal contact can be achieved, however, by tensioning the thin film substrate so as to force the thin film substrate against the chilled drum. However, it has been found that the needed tension invariably exceeds the yield strength of the thin film substrate, resulting in plastic deformation of the thin film substrate and corresponding undesirable, substantial displacements of the through holes.

Significantly, the invention still further involves the unexpected finding that by first forming a very thin seed layer of, for example, chromium and copper on a thin film substrate of polymeric material and then forming through holes in the resulting composite, that such a composite can then be subjected to the tensioning needed to achieve good thermal contact with a chilled drum, without exceeding the yield strength of the composite. As a result, the through holes in the composite are readily metallized using vapor phase deposition, while avoiding displacements of the through holes due to heating effects or plastic deformation of the thin polymeric film.

By virtue of the above finding thin film devices, such as thin film polymeric chip carriers and thin film flexible electrical cables, having metallized through holes and, for example, metallized lands which substantially overlap and substantially encircle the corresponding through holes, and circuit lines which intersect the metallized lands, are now readily fabricated, for the first time. In addition thin film devices, such as thin film polymeric chip carriers and thin film flexible electrical cables, having metallized through holes and metallized circuit lines which are substantially aligned with, and which substantially directly intersect, the corresponding metallized through holes, are

BRIEF DESCRIPTION OF THE DRAWINGS

The invention is described with references to the accompanying drawings, not drawn to scale, wherein.

DETAILED DESCRIPTION

Figure 1A:
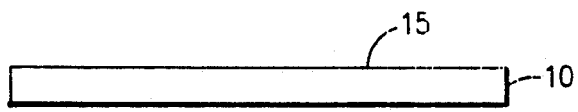
FIGS. 1(a)-1(g) depict the steps involved in applying the inventive through-hole-metallization method to the fabrication of a thin film chip carrier.

The invention involves a method for metallizing through holes in thin film substrates of, for example, organic polymeric material, such as polyimide, polytetrafluoroethylene, polyetheretherketone, polyethersulfone and polyester, as well as the resulting devices including, for example, thin film chip carriers and thin film flexible electrical cables.

As discussed, the invention involves the finding that conventional wet seeding procedures yield seed layers of palladium and tin on the side walls of through holes in thin polymeric films which exhibit unacceptably low adhesion. The invention also involves the finding that seed layers of, for example, chromium and copper, exhibiting acceptably high adhesion, are readily vapor phase deposited, e.g., sputtered or electron-beam evaporated, onto the side walls of through holes in thin polymeric films. However, the metal atoms, e.g., chromium and copper atoms, being vapor phase deposited usually possess substantial kinetic energy, and therefore the impact of these atoms on the thin polymeric films results in this kinetic energy being converted into a significant amount of heat which is absorbed by the thin films. Because the vapor phase deposition of these metal atoms usually occurs under vacuum, the only heat transfer mechanism available for dissipating this heat to the surrounding environment is radiation, which is ineffective for the purpose of significantly cooling the thin films. In addition, the thermal conductivities, $\alpha$, of thin polymeric films, such as polyimide, polytetrafluoroethylene, etc., at 25° C. are relatively low and are typically equal to or less than 2.0 watts/meter °K. (By way of example, the thermal conductivity, $\alpha$, at 25° C. of the polyimide sold by DuPont under the tradename Kapton is 0.12 watts/meter °K.) Consequently, when metal is deposited onto a portion of a thin polymeric film in, for example, a roll format, the thermal conductivity in a direction along the length of the roll, which length direction is transverse to the thickness direction of the film, is correspondingly low. But this implies that relatively little heat is transferred via internal heat conduction from the film portion being subjected to metal deposition to the film portions mounted on, for example, wind and unwind reels. Moreover, the coefficient of thermal expansion (CTE) of such a polymeric film in the length direction and the width direction, which is also transverse to the thickness direction, is relatively high and at 25° C. is typically equal to or greater than $5 \times 10^{-6}$ cm/cm °C. (By way of example, the CTEs at 25° C. of the polyimide sold by DuPont under the tradename Kapton and the polyimide sold by Imperial Chemical Industries under the tradename Upilex are, respectively, $1.8 \times 10^{-5}$ cm/cm °C. and $0.8 \times 10^{-5}$ cm/cm °C.) As a result, such a thin polymeric film undergoes significant thermal expansion in the length and/or width directions during vapor phase deposition of metal. But this implies that the through holes in the thin polymeric film undergo corresponding, significant thermal displacements, which vary in size along the length and width directions, which are undesirable for the reasons discussed above.

As also discussed, simply mounting a thin, bare, polymeric film having through holes on a chilled drum during the vapor phase deposition process is ineffective in cooling the thin film in the areas of the through holes. That is, the through holes are typically formed using conventional drilling techniques, e.g., conventional mechanical drilling techniques, which leave burrs at the bottoms of the holes. Unfortunately, such burrs preclude good thermal contact between the thin film and the chilled drum in the areas of the through holes, i.e., the thin film puckers up in the areas of the through holes, leaving what are called heat creases. Moreover, even thin films having through holes formed by laser drilling, which leaves essentially no burrs, fail to achieve good thermal contact and also exhibit heat creases.

As also noted, attempts to subject a thin polymeric film to tension, to thereby achieve good thermal contact between the film and the chilled drum, have proven to be counterproductive because the minimally required tension invariably exceeds the yield strength of the film. Consequently, the film undergoes significant plastic deformation in the length direction and the width direction (due to a Poisson-like effect), resulting in the through holes undergoing corresponding, undesirable, significant displacements.

Surprisingly, it has been found that the undesirable plastic deformation of a thin polymeric film can be prevented by forming a relatively thin, metal-containing seed layer on the upper or lower surface of the polymeric film before through holes are drilled in the resulting composite. Significantly, the presence of the seed layer, which has a thickness which is much smaller than that of the polymeric film, substantially increases the stiffness of the composite. As a result, when the composite is mounted on a chilled drum during vapor phase deposition of metal, the composite is readily subjected to a tension which achieves good thermal contact with the chilled drum, i.e., no heat creases are produced in the polymeric film in the region of the through holes, without exceeding the yield strength of the composite. Consequently, plastic deformation of the polymeric film is avoided, and therefore the through holes undergo no displacement due to such plastic deformation.

It should be noted that during vapor phase deposition of metal onto a composite wrapped around a chilled drum, the metal being deposited will not only fall onto the sidewalls of the through holes in the composite, but will necessarily also fall onto the exposed surface areas of the chilled drum at the bottoms of the through holes. This is undesirable because the presence of this metal on the chilled drum reduces the chilled drum surface area available for heat transfer, and tends to lift up the composite out of contact with the chilled drum. Significantly, it has been found that this problem is readily overcome by wrapping a thin film of polymeric material, such as a polyimide, around the chilled drum before mounting the composite on the chilled drum. The thickness of such a wrap is, for example, 50 micrometers (microns). Thus, during vapor phase deposition of metal, the metal falls onto the wrap, which can be replaced from time to time, rather than onto the chilled drum.

If a thin film substrate with through holes is to be used as a thin film chip carrier or as a thin film flexible electrical cable, then metallized lands have to be formed about each metallized through hole and metallized circuit lines have to be formed which intersect the metallized lands. Alternatively, the metallized lands can be dispensed with and metallized circuit lines can be formed which directly intersect the metallized through holes. To achieve utility as a chip carrier or as a flexible electrical cable, there must be a substantial overlap between each metallized through hole and the corresponding metallized land, or between each metallized through hole and the circuit line which is to directly intersect the metallized through hole. That is, in the former case, if the top of a through hole on, for example, the chip-bearing side of a thin film substrate circumscribes an area $A_1$ and if the outer periphery of the corresponding metallized land circumscribes an area $A_2$ device utility requires that the overlap between $A_1$ and $A_2$ be equal to or greater than 50% of $A_1$, and preferably equal to or greater than 75% of $A_1$, and ideally equal to 100% of $A_1$. In the latter case, if the top of a through hole on the chip-bearing side of a thin film substrate has an outer periphery P and the metallized circuit line which is to directly intersect the through hole has a width W, then at least 50%, and preferably at least 75%, and ideally 100%, of W must contact P.

The conductive heat transfer and tensioning conditions associated with the inventive through-hole-metallization method needed to achieve either of the above overlap requirements is readily determined empirically. That is, a thin seed layer of, for example, chromium and copper is initially formed on one of the major surfaces of a thin film substrate, and through holes are drilled, e.g., mechanically drilled or laser drilled, in the resulting composite. This composite is then mounted on, for example, a chilled drum, preferably encircled by a thin film polymeric wrap and positioned within, for example, the vacuum chamber of a sputter deposition machine or an evaporation machine, such as an electron-beam evaporation machine. A thin seed layer of, for example, chromium and copper is then sputter deposited or evaporated onto the other major surface of the film and onto the sidewalls of the through holes. For a fixed metal deposition rate and a fixed chilled drum temperature, the tension needed to prevent heat creases in the film in the areas of the through holes is readily determined by varying the tension and visually inspecting the thin film for the presence of heat creases. However, preventing heat creases, while essential, will not ensure that either of the above overlap conditions will be met because the thermal displacements of the through holes are determined by the heat load to which the thin film substrate is subjected, which is determined by the metal deposition rate and the chilled drum temperature. Thus, in accordance with the invention, after the seed layer is formed on the film and on the sidewalls of the through holes, the seed layer on either the upper or lower surface of the composite is patterned to form the corresponding lands and/or circuit lines, using conventional photolithographic techniques, assuming no significant displacements of the through holes. If the desired overlap condition is not met, as determined by inspection of the film, then the above procedure is repeated, but either the metal deposition rate or the chilled drum temperature is reduced, or both.

As a pedagogic aid to a more complete understanding of the invention, the application of a preferred embodiment of the inventive through-hole-metallization method to the fabrication of a thin film chip carrier is described below, as is the corresponding fabrication apparatus.

With reference to FIG. 1(a), the fabrication of a thin film chip carrier having the new thin film chip carrier configuration, described above, begins with a bare, thin film polymeric substrate 10 of, for example, polyimide, such as the polyimide sold by DuPont under the tradename Kapton or the polyimide sold by Imperial Chemical Industries under the tradename Upilex. This substrate is preferably processed in a roll format (as depicted in FIG. 2). However, for the sake of convenience, only a portion of such a roll is depicted in FIG. 1(a), as well as FIGS. 1(b)–1(g).

The thickness of the thin film polymeric substrate 10 ranges from about 12.5 microns to about 125 microns. Thicknesses less than about 12.5 are undesirable because the corresponding substrates are difficult to handle and are easily torn. On the other hand, thicknesses greater than about 125 microns are undesirable because the corresponding dielectric constants are undesirably large.

While not essential, the first step in the process of fabricating the thin film chip carrier is preferably to subject the upper surface 15 of the thin film substrate 10 to an oxygen plasma, more fully described below. Exposure to the oxygen plasma enhances adhesion of a seed layer, to be deposited onto the surface 15, to the surface 15.

Figure 1B:
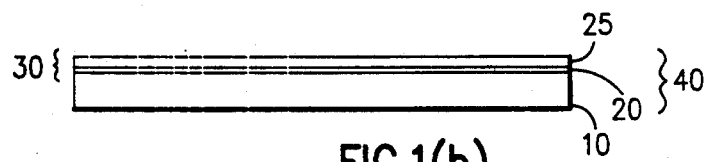
Figure 1C:
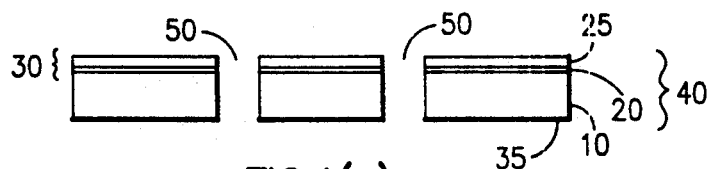
Figure 2:
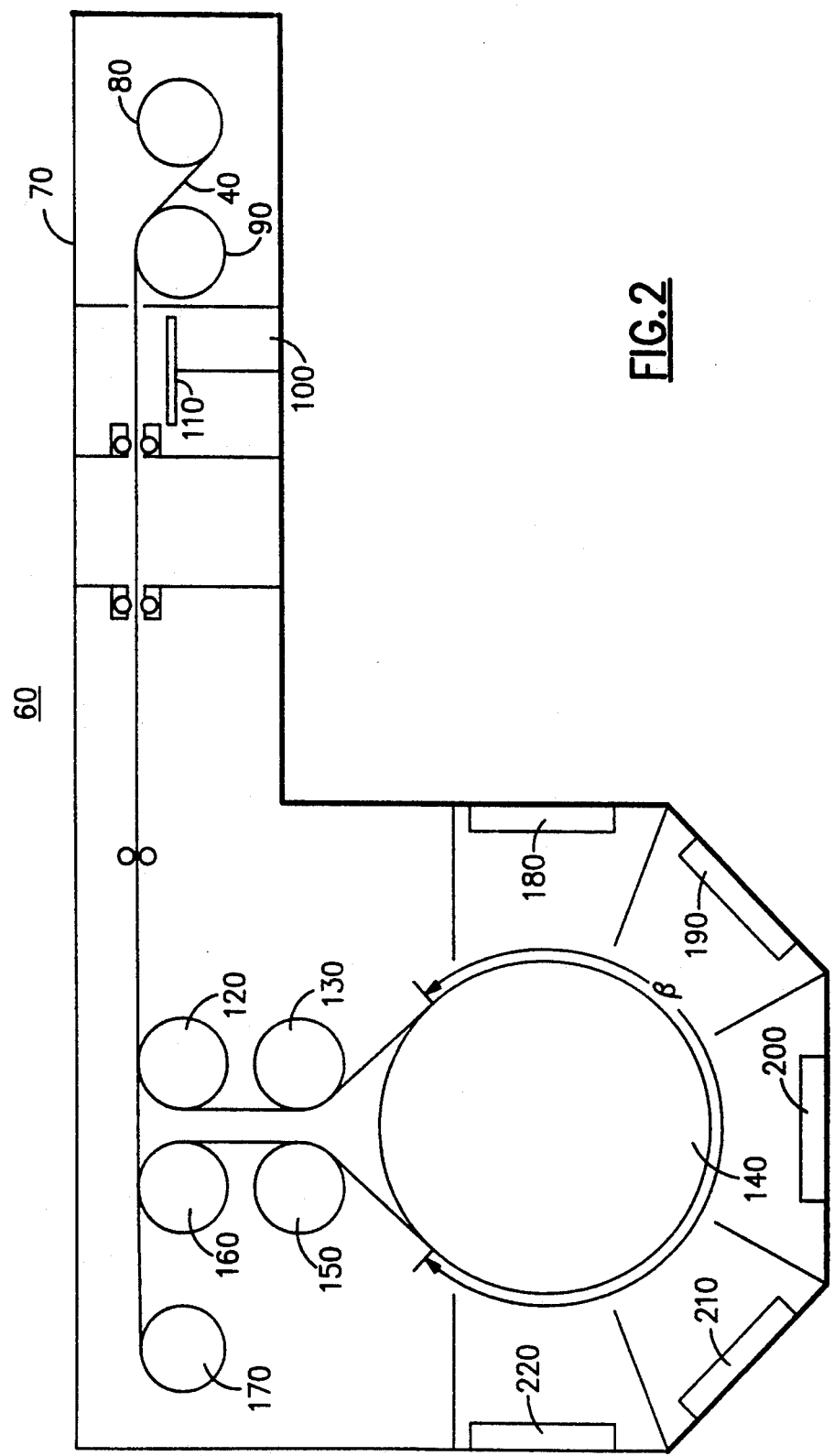
FIG. 2 depicts apparatus useful in implementing the inventive through-hole-metallization method.

After the surface 15 has been modified by exposure to the oxygen plasma, a thin seed layer 30 is deposited onto the surface 15, as depicted in FIG. 1(b), which is ultimately to be patterned into, for example, metallized lands encircling the through holes and/or circuit lines intersecting the metallized lands or directly intersecting example, a relatively thin layer 20 of chromium and a relatively thick layer 25 of copper, with the former serving to enhance the adhesion of the latter to the surface 15. The two layers 20 and 25 are readily deposited via, for example, a magnetron sputtering process, more fully described below. The thickness of the chromium layer 20 ranges from about 100 Angstroms (Å) to about 500 Å. Thicknesses less than about 100 Å are undesirable because the adhesion of the corresponding chromium layers to the surface 15 is undesirably low. Thicknesses greater than about 500 Å are undesirable because they produce undesirable curling of the resulting chromium-covered polymeric substrates. In addition, the thickness of the copper layer 25 ranges from about 3000 Å to about 10,000 Å. Thicknesses less than about 3000 Å are undesirable because the corresponding plating resistances during subsequent copper plating are undesirably high. Thicknesses greater than about 10,000 Å are undesirable because they are unnecessary and involve undesirably high material costs. Therefore, the corresponding thickness of the seed layer 30 ranges from about 3,100 Å to about 10,500 Å. For the sake of convenience, the resulting composite substrate, including the layers 10, 20 and 25, is hereinafter referred to as the composite substrate 40.

At least one through hole, and more typically a plurality of through holes, 50 are now drilled, e.g., mechanically drilled or laser drilled, or mechanically punched, through the thickness of the composite substrate 40. The diameters of the through holes range from about 75 microns to about 1500 microns. Diameters less than about 75 microns are undesirable because, among other reasons, the drills and punches used to produce such holes exhibit undesirably short lifetimes. Diameters greater than about 1500 microns are undesirable because they involve the use of an undesirably large amount of substrate surface area.

The composite substrate 40, with the through holes 50, is now introduced in a roll format into a roll sputter coating apparatus 60 depicted in FIG. 2. This apparatus 60 includes a housing 70, the right hand portion of which (as viewed in FIG. 2) is used for forming an oxygen plasma and the left-hand portion of which is used for sputter depositing metal. It should be noted that the apparatus 60 is useful in forming the seed layer 30 which constitutes a part of the composite substrate 40.

When mounted within the housing 70, the composite substrate 40 is initially wrapped around an unwind reel 80, with the seed layer 30 contacting the unwind reel 80. This unwind reel 80 is intended to rotate in the clockwise direction (as viewed in FIG. 2) to thereby unwind the composite substrate 40. Significantly, the unwind reel 80 is connected to the rotor of an electric motor (not shown), which is capable of rotating in the counterclockwise direction, and thereby opposing the clockwise rotation of the reel 80.

As shown in FIG. 2, after being mounted within the housing 60, the composite substrate 40 extends from the unwind reel 80, over a guide roller 90, into a chamber 100 containing a cathode electrode 110. The composite substrate 40 extends from the chamber 100 to a guide roller 120 and applied to the composite substrate 40, as discussed more fully below. One useful such load cell 130 is, for example, of the type sold by the Nireco company under the tradename MB Tension Sensor.

The composite substrate 40 extends from the load cell 130 around a chilled drum 140, preferably encircled by a thin polyimide wrap (not shown). The chilled drum 140 is, for example, of stainless steel and has a diameter of, for example, 1 meter and a length (the dimension perpendicular to the plane of FIG. 2) equal to or greater than the width of the composite substrate 40. The chilled drum 140 is cooled by flowing a coolant, such as ethylene glycol, through the chilled drum.

From the chilled drum 140, the composite substrate 40 extends to a second load cell 150, then to a guide roller 160 and finally to a windup reel 170, which is intended to rotate in the counterclockwise direction (as viewed in FIG. 2) and thereby wind up the composite substrate 40. Significantly, the windup reel 170 is also connected to the rotor of an electric motor, which is capable of rotating in the counterclockwise direction and thereby aiding the rotation of the windup reel.

Positioned in a semi-circular arc around the chilled drum 140 are five equi-angularly spaced target cathode electrodes 180, 190, 200, 210 and 220. The target electrode 180 is, for example, a chromium target electrode, while the target electrodes 190, 200, 210 and 220 are, for example, copper target electrodes. Significantly, each target electrode includes an elliptically-shaped electromagnet which serves to produce a torodial magnetic field having an intensity of, for example, 400 gauss. By virtue of the presence of these torodial magnetic fields, magnetron sputtering of chromium and copper is achieved, as described below.

During the operation of the apparatus 60, the composite substrate 40 moves from the unwind reel 80, past a number of intervening elements, described above, to the windup reel 170. Because the rotors of the electric motors connected to the reels 80 and 170 rotate in opposite directions, these electric motors are capable of subjecting, and are used to subject, the composite substrate 40 to tension, more fully described below.

Prior to initiating operation of the apparatus 60, the interior of the chamber 100 is evacuated and filled with oxygen gas to a pressure of, for example, $7 \times 10^{-2}$ torr. In addition, during operation, a negative DC voltage of, for example, 800 volts is applied to the cathode electrode 110 while the housing 70 is grounded. As a result, an oxygen plasma is produced in the chamber 100 having an ion density of, for example, $2.5 \times 10^{10}$ ions/cm$^3$. As the composite substrate 40 moves through the chamber 100, the bare polymeric surface 35 (see FIG. 1(c)) of the composite substrate 40 is exposed to this plasma for a period of time equal to, for example, 8.3 seconds.

After exiting the chamber 100, the composite substrate 40 enters the chamber containing the chilled drum 140 and target electrodes 180, 190, 200, 210 and 220. Prior to initiating operation, this chamber is evacuated and filled with an inert gas, such as argon, to a pressure of, for example, $2 \times 10^{-3}$ torr. In addition, during operation, a negative DC voltage of, for example, 500 volts is applied to each of the target electrodes 180, 190, 200, 210 and 220. As a consequence, a plasma is struck in the argon gas. Positively charged ions in the plasma are attracted to the target electrodes by the negative voltages applied to the target electrodes. In addition, the magnetic fields produced by the electromagnets associated with the target electrodes serve to produce a relatively high density of electrons around the target electrodes, which increases ionization. The impact of the positively charged ions on the target electrodes dislodges chromium and copper target atoms, which impinge upon, and adhere to, the bare polymeric surface 35 of the composite substrate 40 and the sidewalls of the through holes in the composite substrate 40.

As discussed above, applying appropriate tension to the composite substrate 40 is essential to achieving good thermal contact between the composite substrate 40 and the chilled drum 140, and thereby preventing heat creases in the composite substrate 40. In addition, the rate of deposition of chromium and copper must be chosen in relation to the temperature of the chilled drum so as to substantially prevent thermal displacements of the through holes and thereby meet either or both of the overlap criteria discussed above.

The above objectives are readily achieved by employing the empirical procedure described above. For example, let us assume that the composite substrate 40 (see FIG. 1(c)) includes a film 10 of the polyimide sold by DuPont under the tradename Kapton, having a thickness of 50 microns. Let us also assume that the chromium layer 20 of the composite substrate 40 has a thickness of 125 Å and that the copper layer 25 has a thickness of 6000 Å. In addition, let us assume that this composite substrate 40 has a width of 17.8 cm, and includes four sets of through holes, with each set including rectangular patterns of 50 to 400 holes per square inch. Let us further assume each through hole has a diameter of 200 microns, and that each through hole is to be encircled by a metallized land having an outer diameter of 400 microns. For such a composite substrate 40, it has been found that an overlap of at least 50% between the lands and through holes is achieved among all the through holes if the metal deposition rate is, for example, 80 Å/sec and the temperature of the chilled drum is 0° C. In addition, assuming the chilled drum 140 has a diameter of 1 meter and the contact angle, $\beta$ (see FIG. 2), between the composite substrate 40 and the chilled drum 140 is, for example, 284 degrees, then the tension needed to prevent heat creases is 25 kilograms.

It must be emphasized that the specific conditions given above are not unique, and that other chilled drum temperatures, deposition rates, contact angles, and tensions are also useful.

Figure 1D:
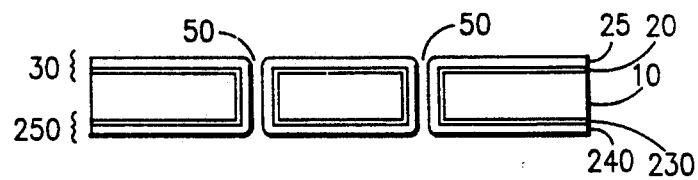

The function of the apparatus 70 is to deposit a seed layer 250 (see FIG. 1(d)), including a relatively thin chromium layer 230 and a relatively thick copper layer 240, onto the bare polymeric surface 35 of the composite substrate 40 and onto the side walls of the through holes 50. The seed layer 250 covering the bottom of the composite substrate 40, after appropriate photolithographic patterning, may be used, for example, as a ground plane and/or a power conductor. The thickness of the chromium layer 230 of the seed layer 250 ranges from about 100 Å to about 500 Å. Thicknesses outside this range are undesirable for the reasons given above. In addition, the thickness of the copper layer 240 ranges from about 3,000 Å to about 10,000 Å. Again, thicknesses outside this range are undesirable for the reasons given above. Thus, the thickness of the seed layer 250 ranges from about 3,100 Å to about 10,500 Å.

Figure 1E:
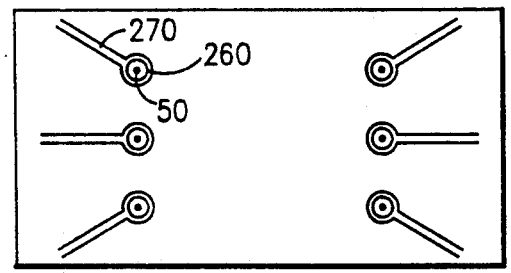
Figure 1F:
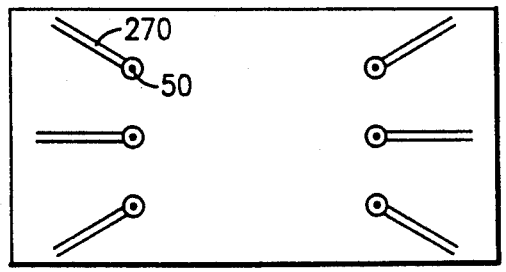

After the formation of the bottom seed layer 250, the top seed layer 30 is photolithographically patterned to form lands 260 encircling the through holes 50 and circuit lines 270 intersecting the lands 260, as depicted in FIG. 1(e). Alternatively, the lands 260 are dispensed with and circuit lines 270 are formed which directly intersect the through holes 50, as depicted in FIG. 1(f). In addition, the bottom seed layer is photolithographically patterned to form a ground plane and/or a power conductor (not depicted).

It should be noted that the outer diameters of the lands 260 should be greater than the diameters of the corresponding through holes but equal to or less than about 3000 microns. Diameters greater than about 3000 microns are undesirable because they involve the use of an undesirably large amount of substrate surface area. In addition, the widths of the circuit lines 270 range from about 12.5 microns to about 625 microns. Widths less than about 12.5 microns are undesirable because such lines exhibit undesirably high electrical resistance. Widths greater than about 625 microns are undesirable because they involve the use of an undesirably large amount of substrate surface area.

Subsequent to the above-described patterning, conventional electroplating techniques are used to deposit additional copper onto the side walls of the through holes 50, onto the lands 260, onto the circuit lines 270 and onto the ground plane and/or power conductor, to form a thin film polymeric chip carrier.

Figure 1G:
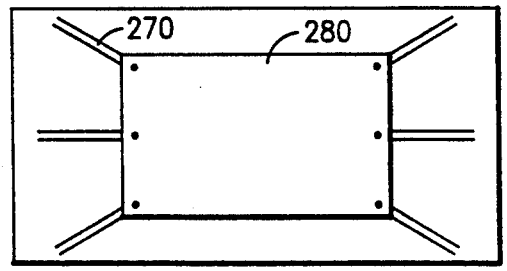

One or more integrated circuit devices 280 are now readily mounted onto the thin film polymeric chip carrier, as depicted in FIG. 1(g), using, for example, solder balls or wire bonds to mechanically and electrically connect contact pads on the integrated circuit device 280 to the circuit lines 270.

While the invention has been particularly shown and described with reference to preferred embodiments thereof, it will be understood by those skilled in the art that various changes in form and detail may be made therein without departing from the spirit and scope of the invention.

We claim:
1. A device, comprising:
a device which includes first and second surfaces and at least one through hole extending through the thickness of said substrate from said first surface to said second surface, said at least one through hole containing metallic material, a top of said through hole at said first surface circumscribing a first area, $A_1$;
at least one metallic land on said first surface which is adjacent to said at least one through hole, an outer periphery of said metallic land circumscribing a second area, $A_2$, Characterized In That said metallic material contained in said at least one through hole is essentially free of a layer of an essentially pure, palladium-tin colloid and includes a metallic, vapor phase deposited seed layer and an overlying, metallic, non-vapor phase deposited layer, said seed layer including a first, relatively thin layer and a second, relatively thick layer, said first layer serving as an adhesion layer for said second layer, said substrate includes material having a thermal conductivity, in a direction transverse to the thickness direction of said substrate, at 25° C., equal to or less than 2.0 watts/meter °K., and a coefficient of thermal expansion, in a direction transverse to the thickness direction of said substrate, at 25° C., equal to or greater than $5 \times 10^{-6}$ cm/cm °C., and $A_1$ overlaps $A_2$, the amount of said overlap being equal to or greater than 50% of $A_1$.

2. The device of claim 1, wherein the amount of said overlap is equal to or greater than 75% of $A_1$.

3. The device of claim 1, wherein said material of said substrate includes polymeric material.

4. The device of claim 3, wherein said polymeric material includes polyimide.

5. The device of claim 3, wherein said polymeric material includes polytetrafluoroethylene.

6. The device of claim 3, wherein said polymeric material includes polyetheretherketone.

7. The device of claim 3, wherein said polymeric material includes polyethersulfone.

8. The device of claim 3, wherein said polymeric material includes polyester.

9. The device of claim 1, wherein said second layer includes copper and a thickness of said second layer ranges from about 3000 Å to about 10000 Å.

10. The device of claim 1, wherein said first layer includes chromium and a thickness of said first layer ranges from about 100 Å to about 500 Å.

11. The device of claim 1, wherein said through hole has a diameter ranging from about 75 microns to about 1500 microns.

12. The device of claim 1, wherein said land has a diameter greater than that of said through hole but equal to or less than about 3000 microns.

13. The device of claim 1, further comprising an integrated circuit device mounted on said first surface of said substrate, said integrated circuit device being electrically connected to said land.

14. The device of claim 13, further comprising at least one metallized electrical circuit line on said first surface, said circuit line extending into electrical contact with said land, said integrated circuit device being electrically connected to said circuit line.

15. The device of claim 14, wherein said circuit line has a width ranging from about 12.5 microns to about 625 microns.

16. A device, comprising:
a substrate which includes first and second surfaces and at least one through hole extending through the thickness of said substrate from said first surface to said second surface, said at least one through hole containing metallic material, a top of said through hole at said first surface being characterized by an outer periphery;
at least one metallic electrical circuit line on said first surface, which is adjacent to said through hole, said circuit line being characterized by a width, Characterized In That said metallic material contained in said at least one through hole is essentially free of a layer of an essentially pure, palladium-tin colloid and includes a metallic, vapor phase deposited seed layer and an overlying, metallic, non-vapor phase deposited layer, said seed layer including a first, relatively thin layer and a second, relatively thick layer, said first layer serving as an adhesion layer for said second layer, said substrate includes material having a thermal conductivity, in a direction transverse to the thickness direction of said substrate, at 25° C., equal to or less than 2.0 watts/meter °K., and a coefficient of thermal expansion, in a direction transverse to the thickness direction of said substrate, at 25° C., equal to or greater than $5 \times 10^{-6}$ cm/cm °C., and said metallic circuit line intersects said outer periphery, with at least 50% of the width of said circuit line contacting said outer periphery.

17. The device of claim 16, wherein at least 75% of the width of said circuit line contacts said outer periphery.

18. The device of claim 16, wherein said material of said substrate includes polymeric material.

19. The device of claim 18, wherein said polymeric material includes polyimide.

20. The device of claim 18, wherein said polymers material includes polytetrafluoroethylene.

21. The device of claim 18, wherein said polymeric material includes polyetheretherketone.

22. The device of claim 18, wherein said polymeric material includes polyethersulfone.

23. The device of claim 18, wherein said polymeric material includes polyester.

24. The device of claim 16, wherein said second layer includes copper and a thickness of said second layer ranges from about 3000 Å to about 10000 Å.

25. The device of claim 16, wherein said first layer includes chromium and a thickness of said first layer ranges from about 100 Å to about 500 Å.

26. The device of claim 16, wherein said through hole has a diameter ranging from about 75 microns to about 1500 microns.

27. The device of claim 16, wherein said circuit line has a width ranging from about 12.5 microns to about 625 microns.

28. The device of claim 16, further comprising an integrated circuit device mounted on said first surface of said substrate, said integrated circuit device being electrically connected to said circuit line.

29. A device, comprising:
a substrate which includes first and second surfaces and at least one through hole extending through the thickness of said substrate from said first surface to said second surface, said at least one through hole containing metallic material, a top of said through hole at said first surface circumscribing a first area, $A_1$;
at least one metallic land on said first surface which is adjacent to said at least one through hole, an outer periphery of said metallic land circumscribing a second area, $A_2$;
an integrated circuit device mounted on said first surface of said substrate, said integrated circuit device being electrically connected to said metallic land, Characterized In That
said metallic material contained in said at least one through hole is essentially free of a layer of an essentially pure, palladium-tin colloid and includes a metallic, vapor phase deposited seed layer and an overlying, metallic, non-vapor phase deposited layer, said seed layer including a first, relatively thin layer and a second, relatively thick layer, said first layer serving as an adhesion layer for said second layer, said substrate includes polymeric material having a thermal conductivity, in a direction transverse to the thickness direction of said substrate, at 25° C., equal to or less than 2.0 watts/meter °K. and a coefficient of thermal expansion, in a direction transverse to the thickness direction of said substrate, at 25° C., equal to or greater than $5 \times 10^{-6}$ cm/cm °C., and $A_1$ overlaps $A_2$, the amount of said overlap being equal to or greater than 50% of $A_1$.

30. The device of claim 29, wherein the amount of said overlap is equal to or greater than 75% of $A_1$.

31. The device of claim 29, wherein said polymeric material includes polyimide.

32. A device, comprising a substrate which includes first and second surfaces and at least one through hole extending through the thickness of said substrate from said first surface to said second surface, said at least one through hole containing metallic material, a top of said through hole at said first surface being characterized by an outer periphery at least one metallic electrical circuit line n said first surface which is adjacent to said through hole, said circuit line being characterized by a width; and an integrated circuit device mounted on said first surface of said substrate, said integrated circuit device being electrically connected to said circuit line, Characterized In That said metallic material contained in said at least one through hole is essentially free of a layer of an essentially pure, palladium-tin colloid and includes a metallic, vapor phase deposited seed layer and an overlying, metallic, non-vapor phase deposited layer, said seed layer including a first, relatively thin layer and a second, relatively thick layer, said first layer serving as an adhesion layer for said second layer, said substrate includes polymeric material having a thermal conductivity, in a direction transverse to the thickness direction of said substrate, at 25° C., equal to or less than 2.0 watts/meter °K., and a coefficient of thermal expansion, in a direction transverse to the thickness direction of said substrate, at 25° C., equal to or greater than $5 \times 10^{-6}$ cm/cm °C. and said metallic circuit line intersects said outer periphery, with at least 50% of the width of said circuit line contacting said outer periphery.

33. The device of claim 32, wherein at least 75% of the width of said circuit line contacts said outer periphery.

34. The device of claim 32, wherein said polymeric material includes polyimide.

* * * * *

UNITED STATES PATENT AND TRADEMARK OFFICE
CERTIFICATE OF CORRECTION

PATENT NO. : 5,288,541

DATED : February 22, 1994

INVENTOR(S) : Kim J. Blackwell et al

It is certified that error appears in the above-identified patent and that said Letters Patent is hereby corrected as shown below:

Column 10, line 58, Claim 1, delete "device" insert "substrate"

Signed and Sealed this

Eleventh Day of October, 1994

Attest:

BRUCE LEHMAN

*Attesting Officer*    *Commissioner of Patents and Trademarks*